United States Patent
Sun et al.

(10) Patent No.: US 7,115,978 B2
(45) Date of Patent: Oct. 3, 2006

(54) PACKAGE STRUCTURE

(75) Inventors: Kuo-Yang Sun, Kao-Hsiung (TW); Chia-Ming Yang, Tai-Nan (TW)

(73) Assignee: Orient Semiconductor Electronics, Ltd., Kao-Hsiung (TW)

(*) Notice: Subject to any disclaimer, the term of this patent is extended or adjusted under 35 U.S.C. 154(b) by 0 days.

(21) Appl. No.: 10/711,794

(22) Filed: Oct. 6, 2004

(65) Prior Publication Data

US 2006/0001134 A1  Jan. 5, 2006

(30) Foreign Application Priority Data

Jun. 30, 2004  (TW) ............... 93119793 A

(51) Int. Cl.
*H01L 23/495* (2006.01)
*H01L 23/52* (2006.01)

(52) U.S. Cl. .............. 257/676; 257/666; 257/692; 257/782; 257/E23.031; 257/E23.037; 257/E23.039

(58) Field of Classification Search ............. 257/690, 257/692, 672, 674, 666, 778, 673, 670, 676, 257/782, E23.031, E23.037, E23.039
See application file for complete search history.

(56) References Cited

U.S. PATENT DOCUMENTS

| | | | | |
|---|---|---|---|---|
| 3,436,818 A | * | 4/1969 | Merrin et al. | 29/840 |
| 5,682,057 A | * | 10/1997 | Kuriyama | 257/529 |
| 6,127,206 A | * | 10/2000 | Nakamichi | 438/111 |
| 6,507,120 B1 | * | 1/2003 | Lo et al. | 257/778 |
| 6,608,375 B1 | * | 8/2003 | Terui et al. | 257/691 |
| 6,984,878 B1 | * | 1/2006 | Park et al. | 257/670 |
| 7,005,325 B1 | * | 2/2006 | Chow et al. | 438/123 |

FOREIGN PATENT DOCUMENTS

| | | |
|---|---|---|
| TW | 456015 | 9/2001 |
| TW | 567598 | 12/2003 |

* cited by examiner

*Primary Examiner*—Nathan J. Flynn
*Assistant Examiner*—Victor A. Mandala, Jr.
(74) *Attorney, Agent, or Firm*—Winston Hsu

(57) ABSTRACT

A package structure includes a lead frame having a plurality of leads, each of which includes a first recession, at least a first device, and a plurality of solder joints respectively positioned in the first recessions for connecting the first device to the lead frame.

6 Claims, 5 Drawing Sheets

PACKAGE STRUCTURE

BACKGROUND OF INVENTION

1. Field of the Invention

The invention relates to a package structure, and more particularly, to a package structure capable of achieving greater reliability and production yield.

2. Description of the Prior Art

In the semiconductor industry, the production of integrated circuits is generally divided into two stages: integrated circuit manufacturing and integrated circuit packaging. The manufacturing of integrated circuit includes processes such as wafer manufacturing, circuit design, photomask manufacturing, and wafer dicing. Integrated circuit packaging on the other hand, includes processes such as wire bonding or flip chip assembly for electrically connecting a circuit chip to a substrate or a lead frame.

As the demand of smaller, more functional and complex PDAs, cellular phones, CPUs, and memory modules increases each day, the development of semiconductors also moves toward a direction of higher density packaging. Among many popular package structures, a flip chip (FC) structure with the characteristics of rapid cooling, low inductance, multi-terminal, and small size has been used most commonly in favor of others. In general, a flip chip package involves formation of a plurality of bumps on a chip and the addition of a layer of solder paste on the lead frame. The chip is then attached to the lead frame by melting the paste via a reflow process. Essentially, this type of package structure has already been disclosed in U.S. Pat. No. 6,661,087. Nevertheless, the reflow process often causes the melting-state chip bumps and the solder paste to travel on the lead frame, which eventually causes the chip to move away from its original position and result in problems such as product failure or low production yields.

In the recent history of integrated circuit packaging, passive devices (i.e. electrical resistors, capacitors, or inductors) have often been used for applications requiring high frequency or various other electrical properties. In the past, passive devices have generally been placed on the surface of printed circuit boards (PCBs). However, in order to reduce the space occupied on the PCB, most passive devices today are integrated into the chip. Eventually, a system in a package (SiP) was formed to provide a high efficiency, low cost, and small size package design for the market.

In the SiP design, the solder paste is often used as a linking medium between the passive device and the lead frame. After being processed by a reflow process via high temperature, the melting solder paste readily bonds the passive device and the lead frame together. Nevertheless, the reflow process often causes the solder paste to travel on the lead frame and the passive device to shift from its original position and results in problems such as product failure or low production yield. Consequently, it becomes a critical matter for the package industry to actively look for a package structure design that is able to effectively prevent the solder paste from moving on the lead frame.

SUMMARY OF INVENTION

It is therefore an objective of the claimed invention to provide a package structure for solving the problems stated previously.

The present invention relates to a package structure. The package structure includes; a lead frame having a plurality of leads, which includes a first recession and a second recession; at least a semiconductor chip; a plurality of first solder joints respectively positioned in the first recessions for connecting the semiconductor chip to the lead frame; at least one passive device having a plurality of outputs respectively positioned in the second recessions; and a plurality of second solder joints respectively positioned in the second recessions for connecting the passive device to the lead frame.

As the present invention includes a plurality of lead frame recessions for fixing each solder joints in place, the joints are likely to remain in its original position during the melting state of a reflow process, thereby significantly increasing the overall yield and reliability of the package structure.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
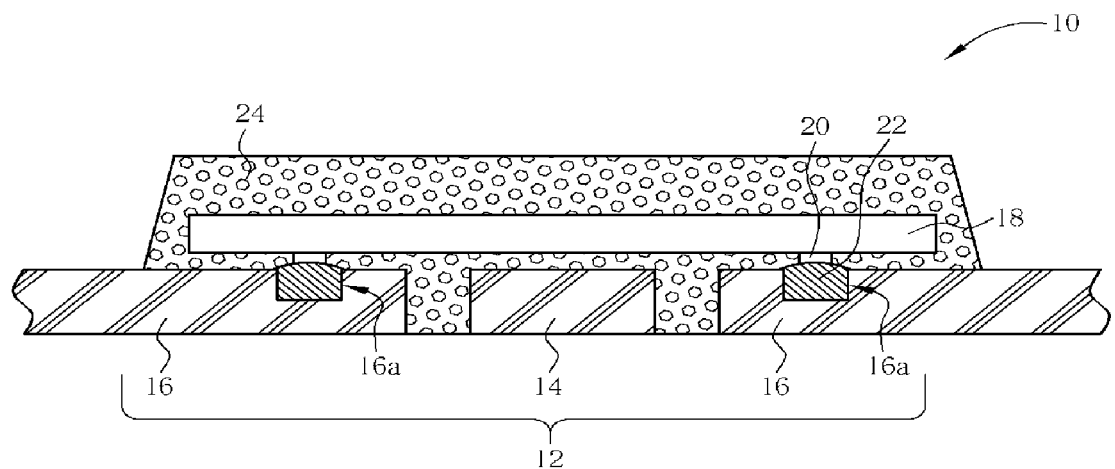
FIG. 1 is a cross-section view of a package structure or the first embodiment of the present invention.
Figure 2:
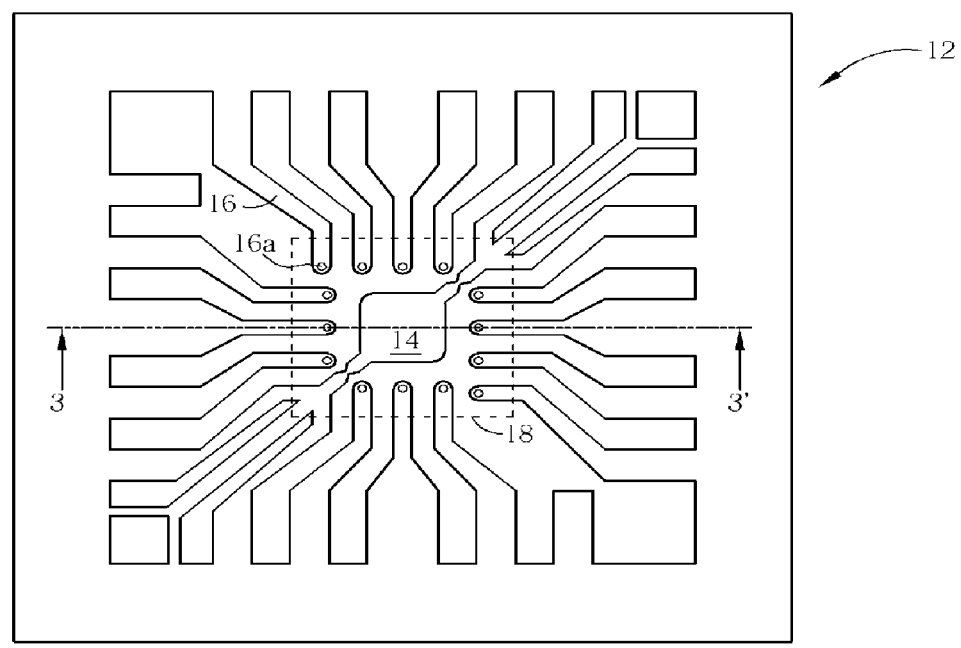
FIG. 2 is a top view of a lead frame from FIG. 1.
Figure 3:
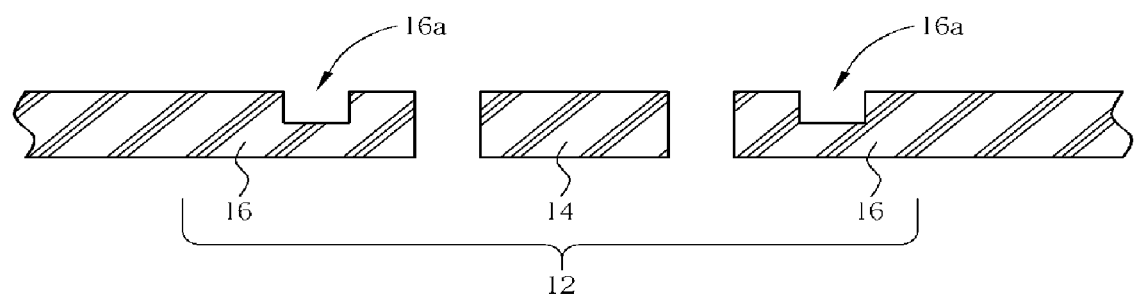
FIG. 3 is a cross-section view of a cross line 3—3' of the lead frame from FIG. 2.

Please refer to FIG. 1 to FIG. 3. FIG. 1 is a cross-section view of a package structure of the firs; embodiment of the present invention. FIG. 2 is a top view of a lead frame from FIG. 1 and FIG. 3 is a cross-section view of a cross line 3—3' of the lead frame from FIG. 2. As shown in FIG. 1, the package structure 10 includes a lead frame 12, at least a device 18 located on the lead frame 12, a plurality of solder joints 22 located between the lead frame 12 and the device 18, and a mold compound 24 disposed around the device 18. As shown in FIG. 2 and FIG. 3, the lead frame 12 includes a die pad 14 for holding the device 18 and a plurality of leads 16, each of which contains a recession 16a. In addition, as indicated in FIG. 1, the device 18 includes a semiconductor die with a active surface and a plurality of bumps 20 are formed on active surface of semiconductor die, in which each of the bumps 20 is connected to each recession 16a via the solder joint 22. In general, the lead frame 12 comprises metal material (such as copper alloy or iron alloy), and the solder joint 22 comprises tin or tin alloy. In order to increase the defense mechanism of the device 18 to water vapor and oxidation, the mold compound 24 is composed of high polymeric material such as epoxy. The die pad 14 is connected to the device 18 to serve as a heat sink for radiating heat. Furthermore, a ground pad (not shown) can also be added on top of the die pad 14 to electrically connect to a ground connector (not shown) of the device 18.

Figure 4:
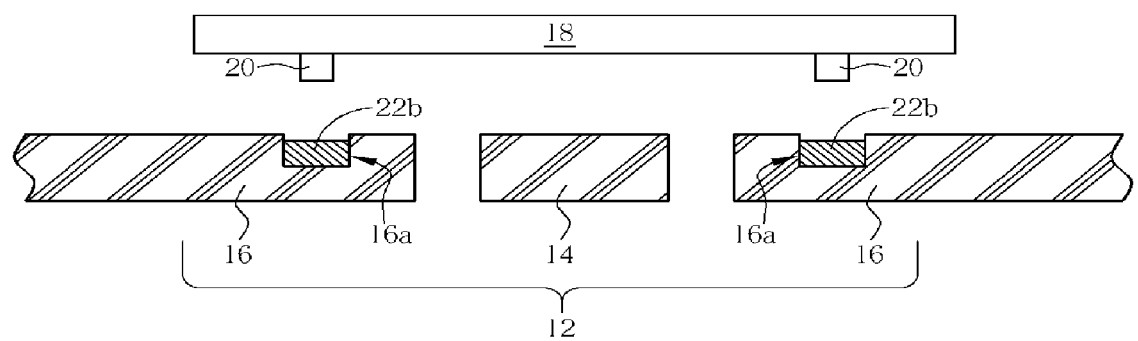
FIG. 4 is schematic diagram of a package structure manufacturing method of the first embodiment of the present invention.

Please refer to FIG. 4. FIG. 4 is schematic diagram of a package structure manufacturing method of the first embodiment of the present invention. As shown in FIG. 4, a plurality of bumps 20 are preformed on active surface of the semiconductor die. A lead frame 12 includes a plurality of leads 16 and a recession 16a is formed on each of the lead 16 via etching and is filled up by solder paste via printing.

Figure 5:
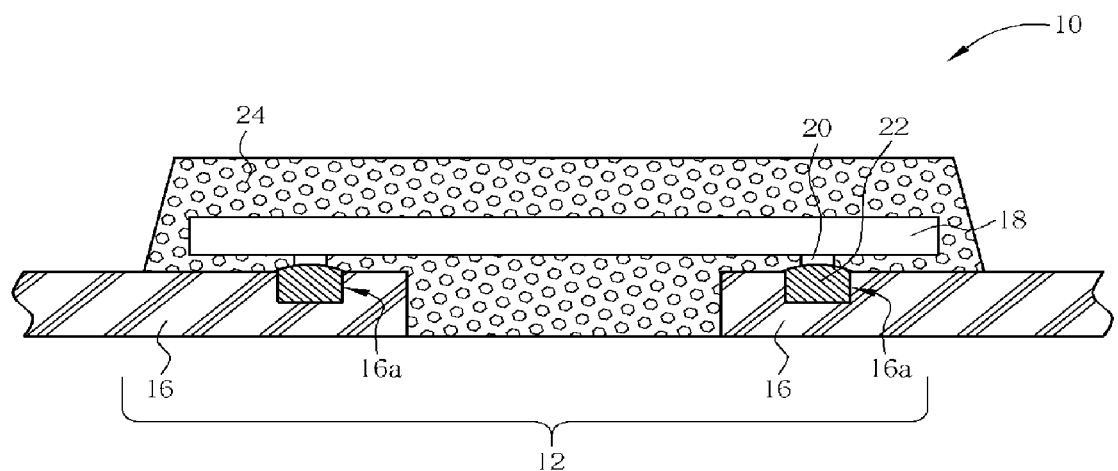
FIG. 5 is a cross-section view of a chip-sink-lacking package structure of the first embodiment of the present invention.

Thereinafter, the device 18 is connected to the lead frame 12 to place each of the bumps 20 within the corresponding recession 16a. Next, a reflow process is performed for melting the solder paste 22b and forming the solder joint 22 as shown in FIG. 1 between the device 18 and the lead frame 12. Eventually, a mold compound 24 is disposed around the semiconductor die 18 for protection. In general, the solder paste 22b is composed of tin or tin alloy. In order to prevent the semiconductor device 18 from any shift in position, the size of each of the recession 16a will need to be larger than each of the bumps 20. Depending on product specification and manufacturing need, the device 18 can also be fixed directly onto the lead 16 by omitting the die pad 14, as shown in FIG. 5. FIG. 5 is a cross-section view of a chip-sink-lacking package structure of the first embodiment of the present invention.

As noted previously, the metal lead frame 12 of the present invention includes a plurality of recessions 16a for fixing each bump 20 in place. In other words, the recessions 16a are formed within the lead 16, such that the solder joint and recession combination functions to provide a means of support for the semiconductor device 18 thereby preventing the device from any movement during reflow processes. As a result, the present invention is able to maintain the electrical performance of the semiconductor device 18 and ultimately increase the overall yield and reliability of the package structure 10.

Figure 6:
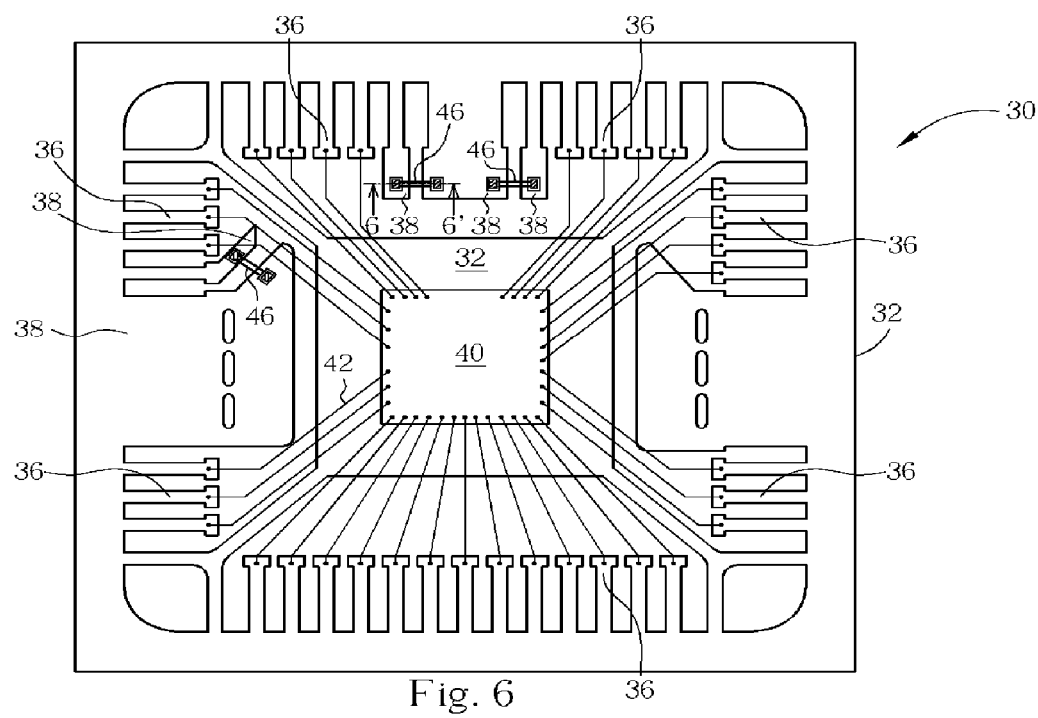
FIG. 6 is a top view of a package structure of the second embodiment of the present invention.
Figure 7:
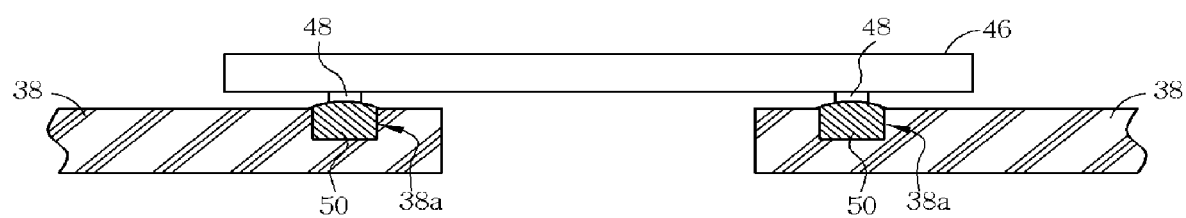
FIG. 7 is a cross-section view of a cross line 6—6' of the package structure from FIG. 6.

Please refer to FIG. 6 and FIG. 7. FIG. 6 is a top view of a package structure of the second embodiment of the present invention and FIG. 7 is a cross-section view of a cross line 6—6' of the package structure from FIG. 6. As shown in FIG. 6, the package structure 30 includes a lead frame 32, at least a device 40 located on the lead frame 32, and a plurality of passive devices 46 located on the lead frame 32. The lead frame 32 further includes a die pad 34 for holding the device 40 and a plurality of leads 36 and 38. The device 40 is connected to each lead 36 via a lead wire 42. Conceptually, the device 40 can be connected to the lead 38 of the passive device 46 via a lead wire. As shown in FIG. 6 and FIG. 7, the passive device 46 includes a plurality of outputs 48, in which each of the outputs 48 is respectively positioned in the recession 38a and connected to the lead 38 via a plurality of solder joints 50. Preferably, the device 40 is a semiconductor die and each of the passive devices 46 is an electrical resistor, a capacitor, or an inductor. The lead frame 32 is composed of metal (such as copper alloy or iron alloy) and the solder joint 50 is composed of tin or tin alloy. The package structure 30 also includes a mold compound (not shown) disposed around the semiconductor die 40 and each of the passive devices 46 for protecting the devices.

Essentially, by connecting the passive device 46 to the recessions 38a of the lead 38 via outputs 48 and solder joints 50, the present invention is able to prevent the passive device 46 from any movement during reflow process, thereby increasing the overall yield and reliability of the package structure 30. Preferably, the manufacturing technique of the package structure shown in FIG. 7 is the same as the one in FIG. 4. As shown in FIG. 6, the semiconductor die 40 is electrically connected to each of the leads 36 via wire bonding while the passive device 46 is connected to the recessions 38a of the lead 38 by utilizing the outputs 48 and solder joints 50. Nevertheless, alternative methods of assembling a flip chip package can also be used to electrically connect the chip to each of the lead.

Figure 8:
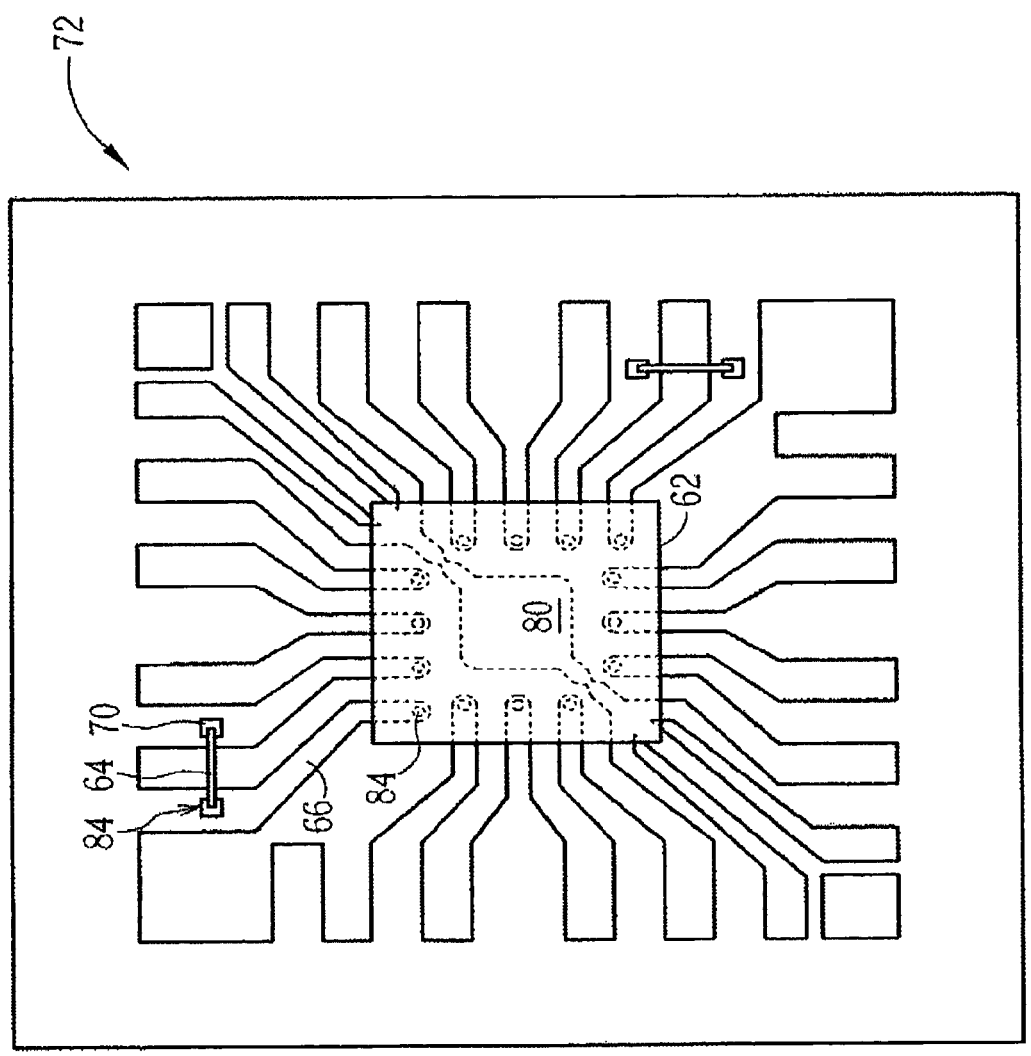
FIG. 8 is a top view of a package structure according to another embodiment of the present invention.

Please refer to FIG. 8. FIG. 8 is a top view of a package structure according to another embodiment of the present invention. As shown in FIG. 8, a package structure having both semiconductor ship and passive device connected to a plurality of leads having recessions via outputs and solder joints is illustrated. According to the present embodiment, the package structure includes a lead frame 72 having a plurality of leads 66 and a plurality of recessions 84 formed in the lead 66, a semiconductor ship 62 and a passive device 64 disposed on the lead frame 72, a molding compound (not shown) disposed on the semiconductor chin 62 and the passive device 64, and a plurality of solder joints 70 positioned in the recessions 84. Preferably, the passive device 64 can be an electrical resistor, a capacitor, or an inductor, and the solder joints 70 are composed of tin or tin alloy. Additionally, the lead frame 72 of the package structure includes a die pad 80 connected to the semiconductor chip 62, in which the die pad 80 is served as a heat sink for radiating the heat produced by the semiconductor chip 62.

In contrast to prior art technology, by utilizing the combination of recessions 16a and 38a and the solder joints 22 and 50 within the lead frame 12 and 32, the present invention is able to prevent the semiconductor chip and passive devices from any movement during reflow processes, thereby increasing the overall yield and reliability of the package structure 10 and 30.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A package structure comprising:
    a lead frame having a plurality of leads, which includes a first recession and a second recession;
    at least a semiconductor chip;
    a plurality of first solder joints respectively positioned in the first recessions for connecting the semiconductor chip to the lead frame;
    at least one passive device having a plurality of outputs respectively positioned in the second recessions; and
    a plurality of second solder joints respectively positioned in the second recessions for connecting the passive device to the lead frame.

2. The package structure of claim 1 wherein the passive device is an electrical resistor, a capacitor, or an inductor.

3. The package structure of claim 1 wherein the second solder joints are comprised of tin or tin alloy.

4. The package structure of claim 1 wherein the lead frame comprises a die pad connected to the semiconductor chip for radiating the heat produced by the semiconductor chip by serving as a heat sink.

5. The package structure of claim 4 wherein the die pad comprises a ground pad connected to both ground and the semiconductor chip.

6. The package structure of claim 1 wherein the first solder joints are comprised of tin or tin alloy.

* * * * *